United States Patent [19]

Okabe et al.

[11] Patent Number: 5,753,943
[45] Date of Patent: May 19, 1998

[54] INSULATED GATE TYPE FIELD EFFECT TRANSISTOR AND METHOD OF MANUFACTURING THE SAME

[75] Inventors: Naoto Okabe, Chita-gun; Makio Iida, Ichinomiya; Norihito Tokura, Okazaki, all of Japan

[73] Assignee: Nippondenso Co., Ltd., Kariya, Japan

[21] Appl. No.: 612,285

[22] Filed: Mar. 7, 1996

[30] Foreign Application Priority Data

Mar. 7, 1995 [JP] Japan ................. 7-047545

[51] Int. Cl.[6] .......................... H01L 29/749
[52] U.S. Cl. ............... 257/139; 257/142; 257/168; 257/172; 257/913; 257/342; 257/339
[58] Field of Search ........................ 257/139, 142, 257/168, 172, 913, 752, 342, 339; 437/946, 10, 12; 438/133, 135, 139, 310, 476, 692

[56] References Cited

U.S. PATENT DOCUMENTS

| 4,676,868 | 6/1987 | Riley et al. | 257/752 |
|---|---|---|---|
| 4,879,258 | 11/1989 | Fisher | 437/225 |
| 5,162,261 | 11/1992 | Fuller et al. | 437/195 |
| 5,234,867 | 8/1993 | Schultz et al. | 437/225 |
| 5,355,013 | 10/1994 | Parker | 257/458 |
| 5,360,748 | 11/1994 | Nadahara et al. | 437/11 |
| 5,397,903 | 3/1995 | Hirose | 257/51 |
| 5,479,031 | 12/1995 | Webb et al. | 257/173 |

FOREIGN PATENT DOCUMENTS

| 450 082 | 10/1991 | European Pat. Off. |
| 471 526 | 2/1992 | European Pat. Off. |
| 549 049 | 4/1994 | European Pat. Off. |
| 63-018675 | 1/1988 | Japan. |
| 1-282872 | 11/1989 | Japan. |
| 3-030310 | 4/1991 | Japan. |
| 4-283968 | 10/1992 | Japan. |
| 86/01638 | 3/1986 | WIPO. |

OTHER PUBLICATIONS

J.A. Topich et al. "Gettering Studies on Oxidation and Epitaxial Defects for Diffused and Implanted Buried Layer Processes", Extended Abstracts, vol. 79-2, Oct. 1979, pp. 1267-1269.
Patent Abstracts of Japan, vol. 17, No. 538 (E-1440) Jun. 1993 re JP 5/152306.
"Low-Dislocation Process Promises Low-Noise Devices", Electronics, vol. 43, No. 21, Oct. 1970, pp. 171-172.
Patent Abstracts of Japan, vol. 14, No. 62 (E-0883), Nov. 1989 re JP 1/282872.
"Elimination of Stacking Faults", IBM Technical Disclosure Bulletin, vol. 19, No. 8, Jan. 1997, pp. 3051-3052.

*Primary Examiner*—Jerome Jackson
*Assistant Examiner*—John Guay
*Attorney, Agent, or Firm*—Cushman Darby & Cushman IP Group of Pillsbury Madison & Sutro LLP

[57] ABSTRACT

In an insulated gate type field effect transistor and a manufacturing method of the same, a diffusion region is formed in a semiconductor substrate under an oxidizing atmosphere by thermal diffusion, and a first conductivity type semiconductor layer is formed on the semiconductor substrate by vapor-phase epitaxy after the formation of the diffusion region. Thereafter, the surface of the semiconductor layer is flattened, and a gate insulating film and a gate electrode are formed on the flattened semiconductor layer. Further, a well region as well as a source region are formed in the semiconductor layer to form an insulated gate type field effect transistor. As the surface of the semiconductor layer in which the insulated gate type field effect transistor is formed is flattened, even if the embedded region is formed in the wafer, the gate-source insulation withstand voltage characteristic can be prevented from being deteriorated.

15 Claims, 8 Drawing Sheets

INSULATED GATE TYPE FIELD EFFECT TRANSISTOR AND METHOD OF MANUFACTURING THE SAME

CROSS REFERENCE TO RELATED APPLICATION

This application is based upon and claims the benefit of priority of the prior Japanese Patent Application No. 7-47545 filed on Mar. 7, 1995, the contents of which are incorporated herein by reference.

BACKGROUND OF THE INVENTION

1. Field of the Invention

The present invention relates to an insulated gate type field effect transistor which is used as a power switching element for a motor driving inverter, an igniter or the like.

2. Related Arts

There has been well known a bipolar integrated circuit in which an embedded region is provided in a semiconductor layer to reduce a collector resistance of a bipolar transistor. A thermal diffusion method is generally used to form such an embedded region. In this method, an oxide film is used as a mask and impurities are diffused through a diffusion window which is formed in the oxide film by partially opening the oxide film. For example, when arsenic (As) is diffused by using a solid source $As_2O_3$, the solid source $As_2O_3$ is vaporized, and then supplied to the diffusion window under carrier gas to diffuse As into the semiconductor layer.

In this case, oxidizing gas is used as the carrier gas, and therefore a thin oxide film is grown on the surface of the semiconductor layer which is exposed to the outside through the diffusion window. That is, a recess is formed on the surface of the underlying silicon layer through formation of the oxide film during the diffusion process. The same phenomenon occurs in case of diffusing other impurities (phosphorus P, antimony Sb, boron B, etc.).

Generally, a silicon layer is then formed at a predetermined thickness by an epitaxial growth method after the mask and the grown oxide film are removed. In this process, a recess is also formed in succession on the surface of the grown silicon layer, and thus the surface of the silicon layer becomes uneven (that is, a step portion is formed on the silicon layer).

The step portion due to the unevenness of the silicon layer is used to position a pattern of the embedded region and a surface pattern (to form elements) in a process of forming a bipolar integrated circuit.

A structure having an embedded region is also known in a vertical type IGBT (insulated gate bipolar transistor) and a vertical type MOSFET (as disclosed in WO91/03842, Japanese Examined Patent Publication No. Hei3-30310).

SUMMARY OF THE INVENTION

Herein, in a case where the embedded region is formed as a buffer layer over the whole interface between a semiconductor substrate and an epitaxial semiconductor layer, there is no problem. However, when the embedded region is partially formed at the interface, it is found by the present inventors that the structure has the problem that the uneven portion on the wafer surface, i.e., the step portions formed corresponding to the embedded region pattern as described above, is overlapped with a pattern of an insulated gate field effect transistor structure which is formed on the upper portion of the wafer, and thereby an element characteristic is deteriorated. That is, in this structure, electric field is more concentrated at the step portion, and thus an electric field value at that portion becomes larger as compared with a MOS structure formed on a flat surface. As a result, the characteristic of an insulation withstand voltage between the gate and the substrate is deteriorated. Further, when the step portion is overlapped with a channel region, there may occur a problem that the channel length and the channel resistance become non-uniform on the plane of a chip, and thus current concentration occurs.

An object of the present invention is to provide an insulated gate type field effect transistor having an embedded region in which the gate-substrate insulation withstand voltage characteristic can be prevented from being deteriorated.

That is, an insulated gate type field electric transistor according to the present invention has an embedded region in a substrate thereof, and a semiconductor layer having a gate oxide film formed on the upper portion thereof, the uppermost surface of the semiconductor layer being flattened so that the dimension of a step portion of the flattened surface is selected to be 8 nm or less.

Specifically, the following manufacturing methods are used when a low-concentration semiconductor layer is epitaxially grown on a high-concentration semiconductor layer to obtain a substrate.

According to a first method, before the epitaxial growth is performed, a diffusion region (which will be an embedded region) is formed under an oxidizing atmosphere by a thermal diffusion method. Then, the low-concentration semiconductor layer is epitaxially grown, and the surface thereof is flattened.

According to a second method, after the diffusion region is formed, the surface of the substrate is flattened, and the rest of the substrate region, i.e., the low-concentration semiconductor layer, is epitaxially grown.

According to a third method, when the diffusion region is formed, an impurity source is given by an oxide film containing impurities and is attached to the surface of the substrate to introduce impurities into the substrate.

According to a fourth method, the diffusion region is formed by an ion implantation method, and then the low-concentration semiconductor layer is formed. In this method, it is important that the substrate region below the diffusion region, e.g., the high-concentration region, is subjected to a gettering treatment. In order to perform the gettering treatment, it is preferable that a high-concentration polycrystalline layer is disposed in the substrate region to be used as a gettering site.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Preferred embodiments according to the present invention will be described hereunder with reference to the accompanying drawings.

(First Embodiment)

FIGS. 1A to 1G are views showing a manufacturing process of a vertical type IGBT (insulated gate bipolar transistor) of a first embodiment of the present invention. These figures show the cross-sectional structure of a unit cell.

Figure 1A:
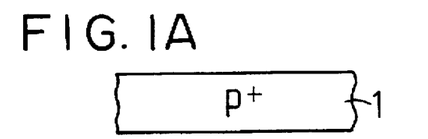
FIGS. 1A to 1G are sectional views showing a manufacturing process according to a first embodiment of the present invention.
Figure 1B:
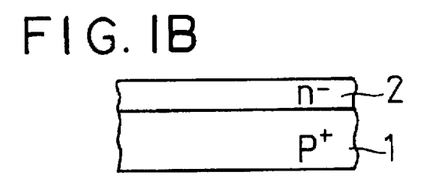
Figure 1C:
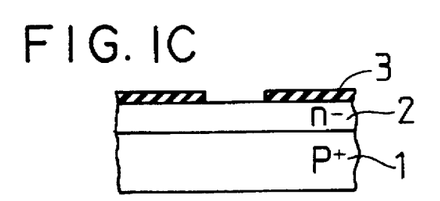

First, a silicon $p^+$ layer 1 serving as a semiconductor substrate is provided (FIG. 1A), and an $n^-$ layer 2 having high resistance is formed on the silicon $p^+$ layer 1 by the vapor-phase epitaxy (VPE) method (FIG. 1B). Thereafter, a thermal oxide film 3 is formed on the surface of the $n^-$ layer 2 by thermally oxidizing the surface of the $n^-$ layer 2, and then subjected to a selective etching treatment to form a diffusion window for impurities (FIG. 1C).

Figure 1D:
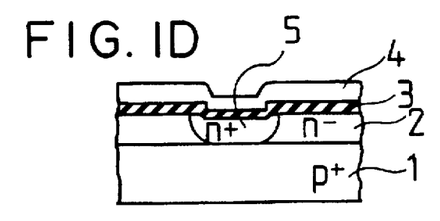

Subsequently, n-type impurities are selectively diffused into the $n^-$ layer 2 by a thermal diffusion method such as a solid-phase diffusion or vapor-phase diffusion method to form a diffusion region 5 (FIG. 1D). In the thermal diffusion method, a solid source may be used as an impurity source as described in "DESCRIPTION OF RELATED ART" or a diffusion source 4 shown in FIG. 1D may be used as an impurity source (i.e., a coating diffusion method may be used). The thermal diffusion is performed under an oxidizing atmosphere in the thermal diffusion method, so that an oxide film is grown at the window portion, and a recess is formed on the surface of the $n^-$ layer 2.

Figure 1E:
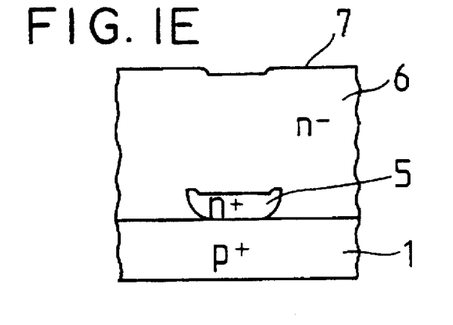
Figure 1F:
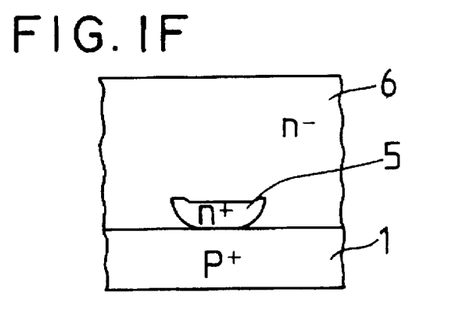

Thereafter, the oxide film 3 is removed, and an $n^-$ layer 6 is formed at a predetermined thickness by the vapor-phase epitaxy method (FIG. 1E). At this time, a recess appears on the surface 7 of the $n^-$ layer 6, and thus the surface 7 becomes uneven. The uneven surface 7 of the $n^-$ layer 6 is flattened by a polishing treatment (FIG. 1F). In the vapor-phase epitaxial process, a recess in a concentration profile of the $n^+$ layer (embedded region) 5, which is formed on the upper portion of the $n^+$ layer 5, is reduced in the diffusion process; however, it may be considered that a slight recess portion remains at the upper portion of the $n^+$ layer 5 in a concentration profile as shown in FIG. 1F.

Figure 1G:
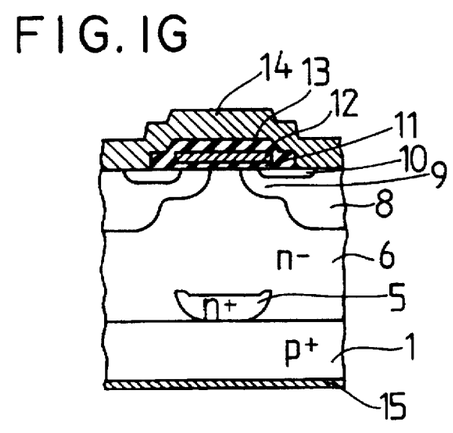

Subsequently, by using the selective diffusion method, a p-type well region 8 is formed at a predetermined position on the surface of the $n^-$ layer 6 which is flattened by the polishing treatment. Further, the surface of the $n^-$ layer 6 is oxidized to form a gate oxide film 11, and a gate electrode 12 is formed on the gate oxide film 11. Subsequently, by using the gate electrode 12 as a mask, a p-type channel-well region 9 and an $n^+$ region 10 are formed in a self-alignment structure by a so-called DSA (Diffusion Self Alignment) technique. Thereafter, an inter-layer insulating film such as BPSG (borophosphorsilicate glass) 13 is deposited over the surface, a contact hole is opened, aluminum is deposited at a thickness of several microns and patterned to form a source electrode 14 as well as a gate pad (not shown), and a metal film is deposited on the back surface of the $p^+$ layer 1 to form a drain electrode 15 (FIG. 1G).

Through the above process, the IGBT element having the embedded region 5 is manufactured. In the IGBT element thus manufactured, a MOS structure portion is formed on the flattened surface of the $n^-$ layer 6, and thus the gate-source insulation withstand voltage characteristic can be prevented from being deteriorated.

Figure 2:
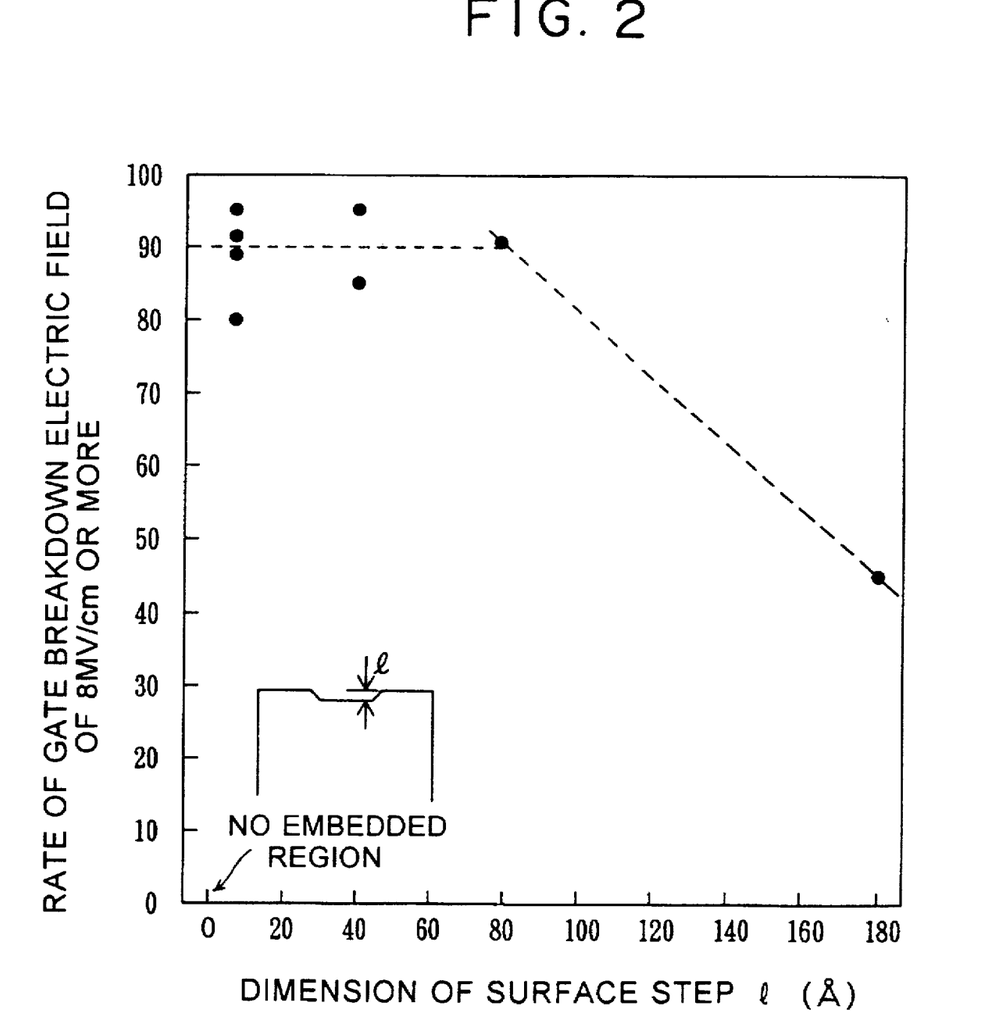
FIG. 2 is a graph showing an experimental result of the relationship between a surface step dimension and a gate-source insulation withstand voltage characteristic.

The relationship between the dimension of the surface step (uneven portion on the surface) and the gate-source insulation withstand voltage characteristic was experimentally checked. The experimental result is shown in FIG. 2. As the dimension of the surface step of the $n^-$ layer 6 becomes smaller, an intensity of the electric field, which induces a gate-source breakdown, increases, and the gate-source insulation withstand voltage characteristic is similar to that of an IGBT element having no embedded region when the surface step dimension is not more than 8 nm. Accordingly, the surface of the $n^-$ layer 6 is preferably flattened so that the surface step dimension is at most 8 nm.

(Second Embodiment)

FIGS. 3A to 3F are views showing a manufacturing process of a vertical type IGBT according to a second embodiment of the present invention.

In the first embodiment, the uneven surface is flattened after the $n^-$ layer 6 is formed. However, in the second embodiment, the surface of the $n^-$ layer 2 is flattened before the $n^-$ layer 6 is formed, thereby beforehand preventing occurrence of unevenness on the surface of the $n^-$ layer 6.

Figure 3A:
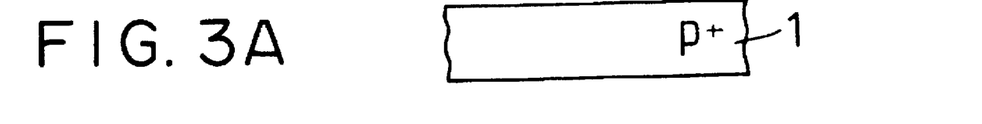
FIGS. 3A to 3F are sectional views showing a manufacturing process according to a second embodiment of the present invention.
Figure 3B:
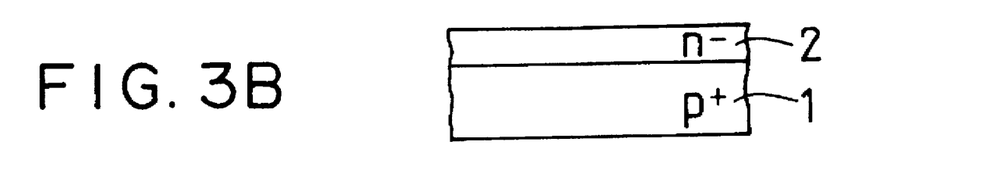
Figure 3C:
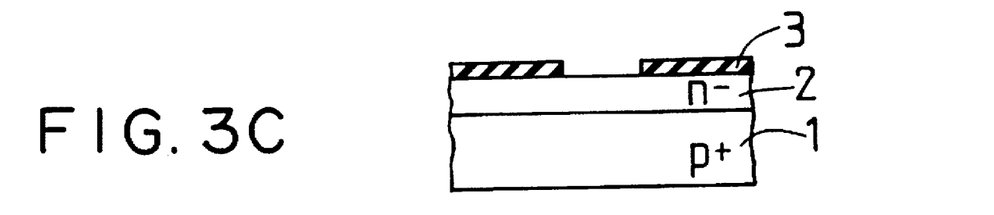
Figure 3D:
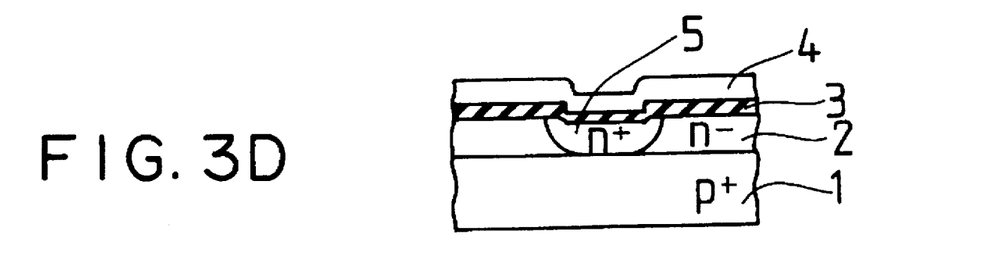
Figures 3E, 3F:
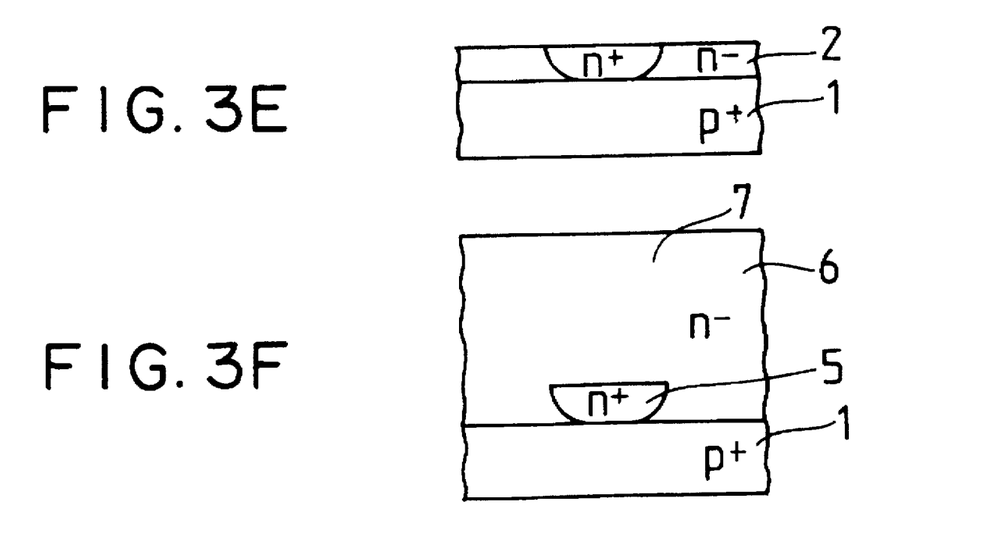

Specifically, the steps shown in FIGS. 3A to 3D which are identical to the steps shown in FIGS. 1A to 1D are carried out, and after the diffusion region 5 is formed, the oxide film 3 is removed and the surface of the $n^-$ layer 2 is flattened. Thereafter, the $n^-$ layer 6 is formed by the vapor-phase epitaxy method (FIG. 3F). In this case, since the surface of the $n^-$ layer 2 is flattened, no unevenness occurs on the surface 7 of the $n^-$ layer 6. Subsequently, MOS structure portion is formed on the surface of the $n^-$ layer 6 in the same manner as the first embodiment.

(Third Embodiment)

FIGS. 4A to 4F are views showing a manufacturing process of a semiconductor device according to a third embodiment of the present invention.

According to the third embodiment, an embedded region is formed by using an ion implantation method.

Figure 4A:
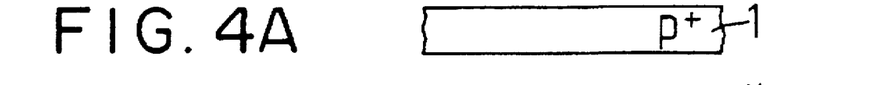
FIGS. 4A to 4F are sectional views showing a manufacturing process according to a third embodiment of the present invention.
Figure 4B:
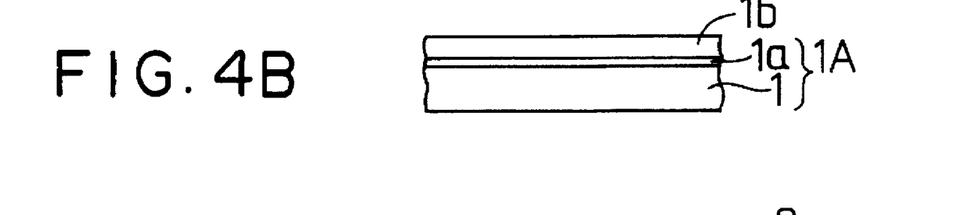

First, a $p^+$ layer 1 serving as a monocrystalline semiconductor substrate is provided (FIG. 4A), and a $p^+$-type polycrystalline layer 1a is formed on the surface of the monocrystalline semiconductor substrate 1 by a chemical vapor deposition (CVD) method. Subsequently, a $p^+$-type monocrystalline semiconductor substrate 1b is laminated on the surface of the monocrystalline semiconductor substrate 1 to sandwich the polycrystalline layer 1a, and both the substrates 1 and 1b are bonded by using a so-called wafer direct bond method. Further, the monocrystalline substrate 1b is subjected to a polishing treatment to set the thickness of the monocrystalline substrate 1b to a predetermined thickness, thereby forming a semiconductor substrate 1A (FIG. 4B).

Figure 4C:
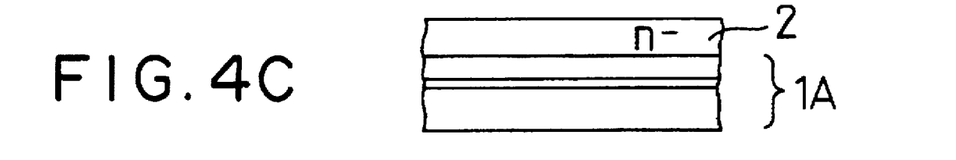
Figure 4D:
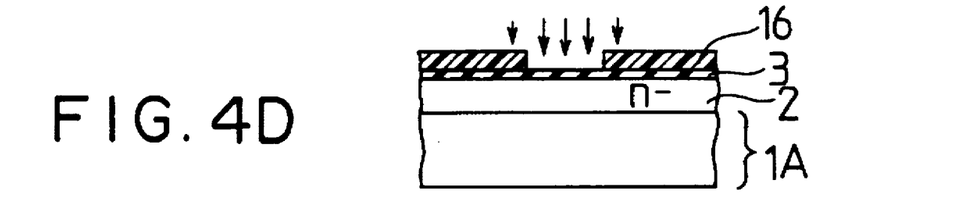

Subsequently, an n⁻ layer 2 having high resistance is formed on the semiconductor substrate 1A by the vapor-phase epitaxy method (FIG. 4C). Thereafter, an oxide film 3 is formed at a predetermined thickness on the surface of the n⁻ layer 2, and a photoresist film 16 having a predetermined pattern is formed on the oxide film 3. Subsequently, for example, ions of arsenic (As) or antimony (Sb) are doped into the n⁻ layer 2 by the ion implantation method using the patterned photoresist film 16 as a mask.

Figure 4E:
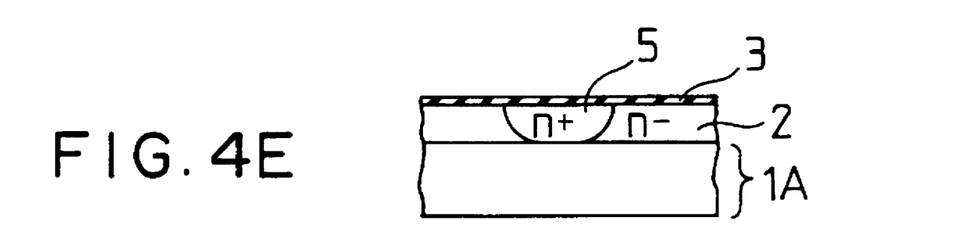
Figure 4F:
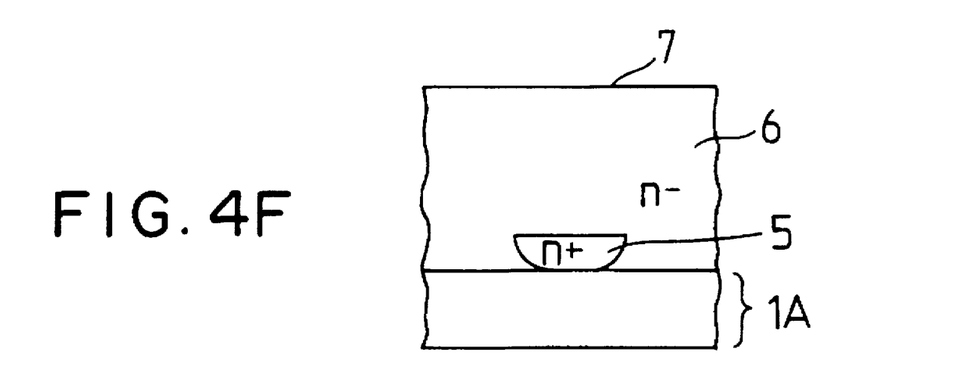

Subsequently, the photoresist film 16 is removed, and a predetermined thermal treatment is performed to form an n⁺ diffusion region 5 (FIG. 4E). Thereafter, the oxide film 3 is removed and an n⁻ layer 6 is formed by the vapor-phase epitaxy method (FIG. 4F). In this case, since the diffusion region 5 is formed by the ion implantation method, the n⁻ layer 2 keeps a flat surface, and thus no unevenness occurs on the surface 7 of the n⁻ layer 6. Subsequently, MOS structure portion is formed on the surface of the n⁻ layer 6 in the same manner as the first embodiment.

Unlike the case where the thermal diffusion method is used like the first and second embodiments, no surface step portion occurs when the embedded region is formed by the ion implantation method.

Figure 9A:
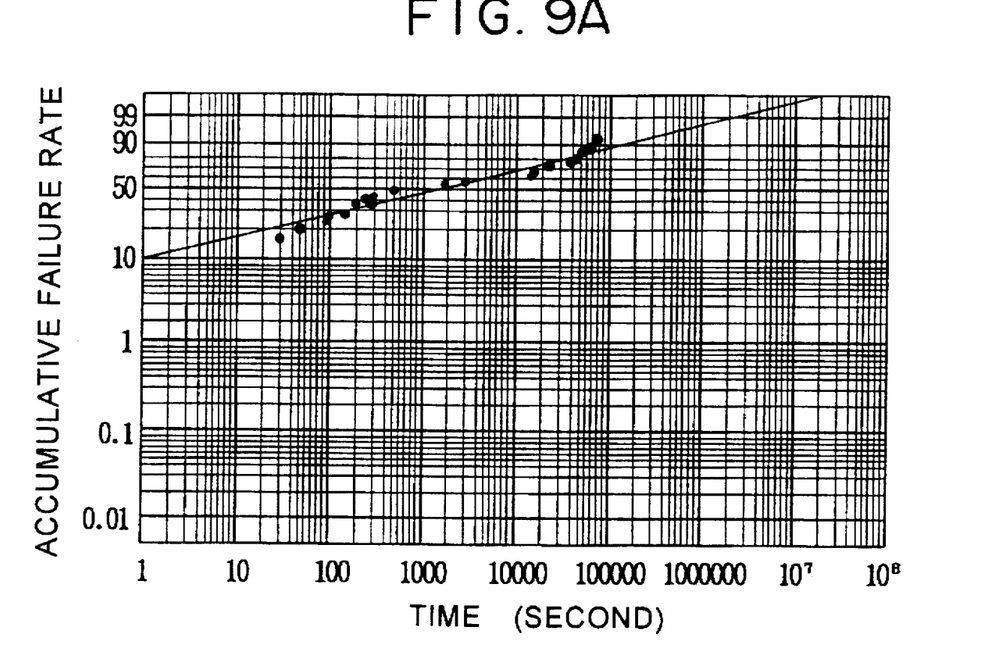
FIGS. 9A and 9B are graphs showing TDDB characteristics obtained by an ion implantation method and a thermal diffusion method, respectively.
Figure 9B:
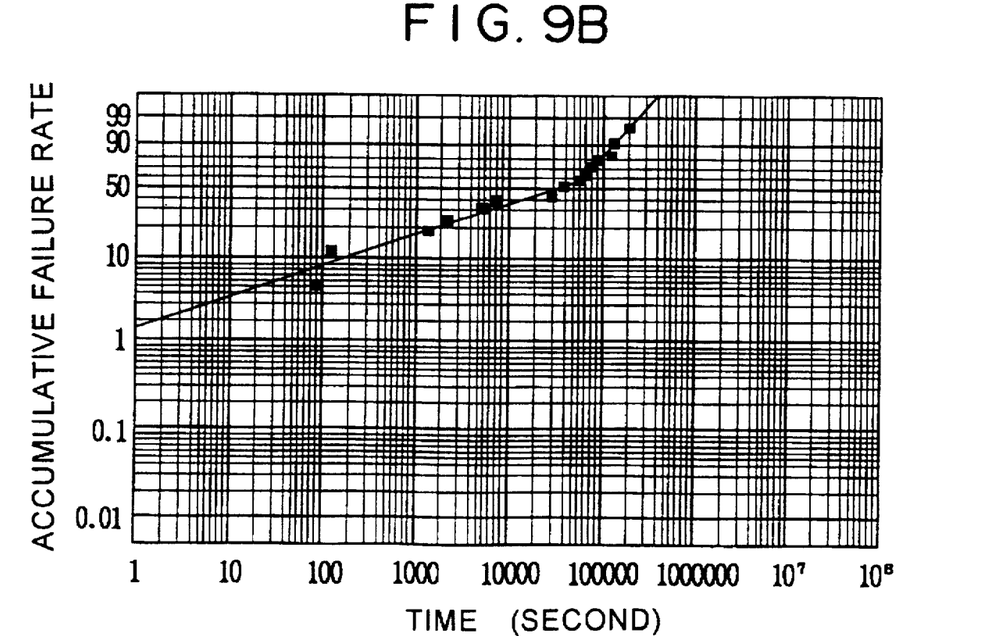

Formation of an embedded region by the ion implantation method is disclosed in Japanese Laid-open Patent Application No. 63-18675, for example. However, the inventors of the present invention had examination on the withstand voltage characteristics of a gate oxide film in the cases where the ion implantation method is simply used and where the thermal diffusion method is used (the surface step dimension is reduced to about 4 nm by the first embodiment), respectively, and thereby found from this examination a fact as follows. FIGS. 9A and 9B show the examination result. Here, the examination was performed on the basis of a TDDB (Time dependent Dielectric Breakdown) characteristic which shows a breakdown rate with time lapse in a state where an electric field of 8 MV/cm is applied to the gate oxide film. FIG. 9A shows the examination result of the case where the ion implantation method is used, while FIG. 9B shows the case where the thermal diffusion method is used. As is apparent from FIGS. 9A and 9B, in the case where the ion implantation method is used, no surface step occurs, however, an accumulative failure rate is higher than in the case where the thermal diffusion method is used. Accordingly, in the case where the embedded region is formed by merely using the ion implantation, there occurs a problem that the gate-source withstand voltage characteristic is deteriorated.

On the other hand, according to the manufacturing process of this embodiment, the polycrystalline layer 1a disposed in the semiconductor substrate 1A and its surrounding portion contain a large number of defects, and this defects containing region in the semiconductor substrate 1A serves as an absorption source for contaminated impurities (for example, heavy metals such as Fe, Al or the like) or the defects in the process of forming the diffusion region 5, that is, it functions as a gettering site.

Accordingly, the film quality of the gate oxide film which is formed on the upper portion of the diffusion region 5 can be made higher by the gettering action of the gettering site, and the withstand voltage characteristic of the gate oxide film when the embedded region is formed by using the ion implantation method can be improved.

In place of the semiconductor substrate 1A, another type of semiconductor substrate may be used as the semiconductor substrate which is subjected to the gettering treatment. This substrate may be performed by forming a defect region on the back surface of a semiconductor substrate through a mechanical process, or by doping a predetermined amount of oxygen into a semiconductor substrate and then subjecting the semiconductor substrate to a predetermined thermal treatment to form oxygen deposition defects at respective portions.

However, in the case of the former substrate, the defect region on the back surface is reduced or lost during the repetitive oxidizing and etching processes in the total process, and thus the gettering effect is weakened. In the case of the latter substrate, the defect amount varies in accordance with the oxygen content and the thermal treatment condition, and thus it is cumbersome to control the defect amount. In view of this point, the case where the polycrystalline layer 1a is used as described above is more excellent than the other two cases, in the point that the defect region of the polycrystalline layer is hardly affected by the thermal treatment condition in the total process, and thus gettering sites having high reproducibility can be formed.

(Fourth Embodiment)

FIGS. 5A to 5E are diagrams showing a manufacturing process of a fourth embodiment of the present invention. The fourth embodiment is a modification of the third embodiment.

Figure 5A:
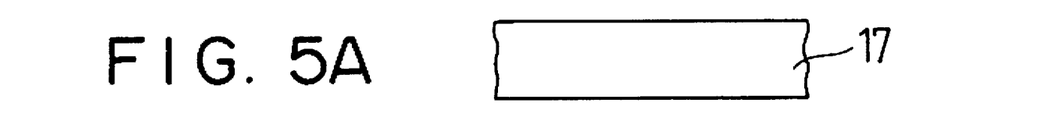
FIGS. 5A to 5E are sectional views showing a manufacturing process according to a fourth embodiment of the present invention.
Figure 5B:
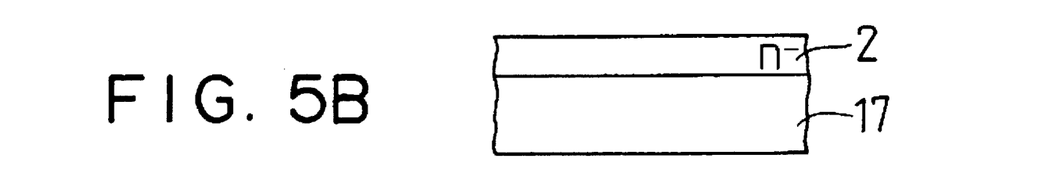
Figure 5C:
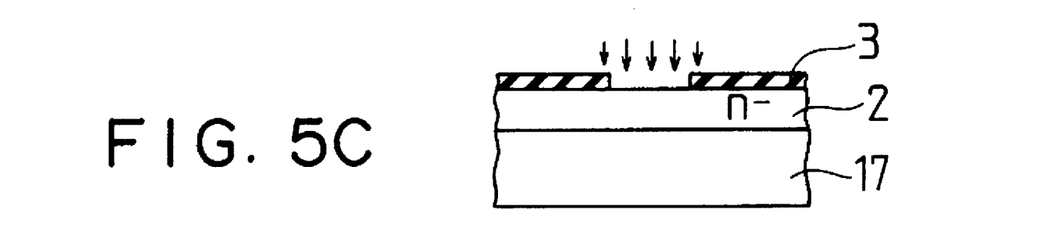

First, a semiconductor substrate 17 which is subjected to the gettering treatment as described above is prepared (FIG. 5A), and an n⁻ layer 2 having high resistance is formed on the semiconductor substrate 17 by the vapor-phase epitaxy method (FIG. 5B). Subsequently, an oxide film 3 is formed at a predetermined thickness on the surface of the n⁻ layer 2, and then it is subjected to a patterning treatment to be formed into a desired pattern. Thereafter, the ions are doped into the n⁻ layer 2 by the ion implantation method using the patterned oxide film 3 as a mask (FIG. 5C).

Figure 5D:
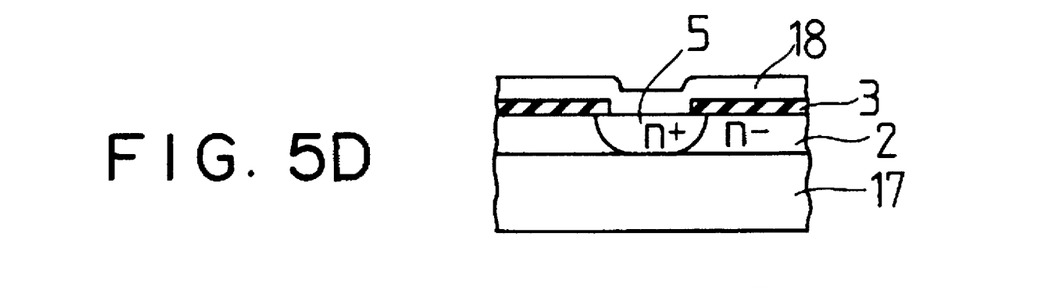
Figure 5E:
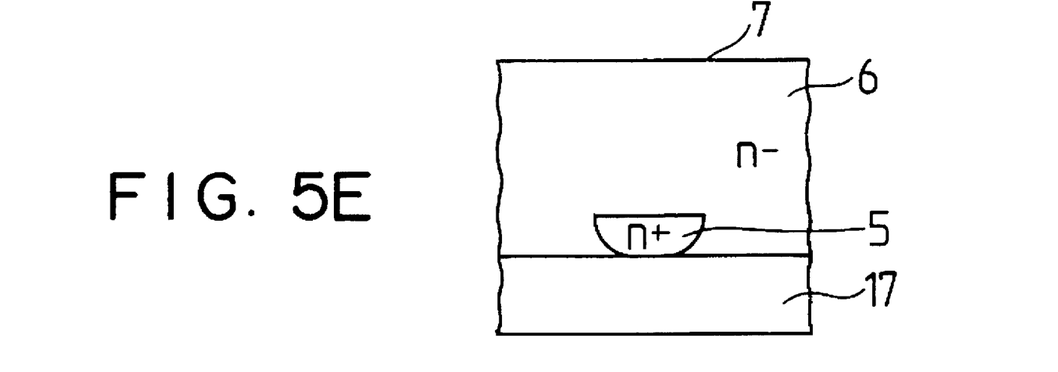

A glass 18 is subjected to a spin coating treatment while the oxide film 3 remains (or after the oxide film 3 is removed), and then subjected to a predetermined thermal treatment to form an n⁺ diffusion region 5 (FIG. 5D). Thereafter, the oxide film 3 and the coated glass 18 are removed, and then an n⁻ layer 6 is formed (FIG. 5E). Subsequently, like the first embodiment, the MOS structure portion is formed on the n⁻ layer 6.

The coated glass 18 functions as a cap with which implanted impurities are prevented from scattering out due to the thermal treatment. That is, in order to prevent the implanted impurities from scattering to the outside due to the thermal treatment during its diffusion process, the diffusion must be performed under an oxidizing atmosphere. In this case, the surface becomes uneven like the first embodiment, and thus the coated glass 18 serving as the cap is used to prevent the formation of the uneven surface due to the thermal treatment.

(Fifth Embodiment)

FIGS. 6A to 6G are views showing a manufacturing process of a semiconductor device according to a fifth embodiment of the present invention.

Figure 6A:
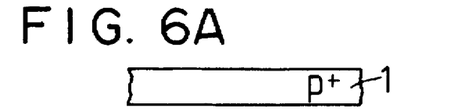
FIGS. 6A to 6G are sectional views showing a manufacturing process according to a fifth embodiment of the present invention.
Figure 6B:
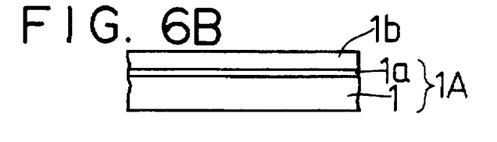
Figure 6C:
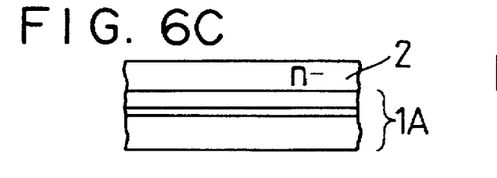
Figure 6D:
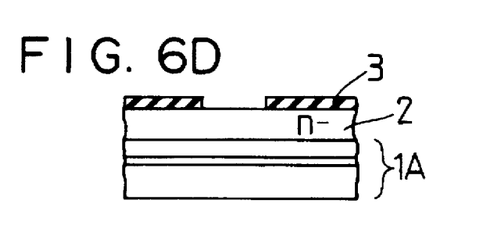
Figure 6E:
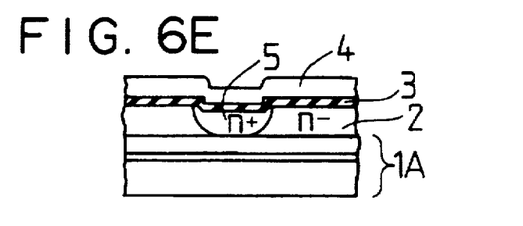
Figure 6F:
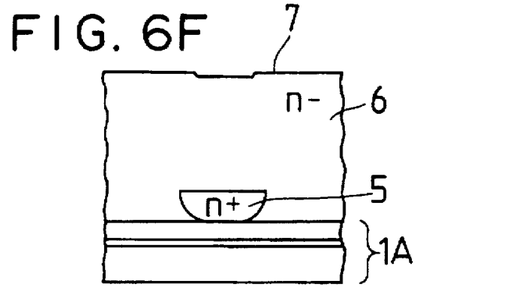
Figure 6G:
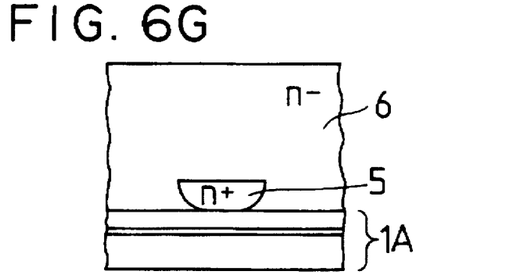

The fifth embodiment corresponds to a modification of the first embodiment, and this embodiment uses a semiconductor substrate 1A using a polycrystalline layer 1a as shown in the third embodiment. The steps of FIGS. 6A to 6C are identical to those of FIGS. 4A to 4C, and through these steps the semiconductor substrate 1A is formed.

Thereafter, in the steps of FIGS. 6D to 6G, the n⁻ layer 2, the diffusion region 5 and the n⁻ layer 6 are formed, and the uneven surface 7 of the n⁻ layer 6 is flattened in the same manner as the steps of FIGS. 1C to 1F. Subsequently, like the first embodiment, the MOS structure portion is formed on the flattened surface of the n⁻ layer 6.

In this case, the gettering action is further applied to the resultant device which is formed with the embedded region by using the thermal diffusion method, and thus the gate-source insulation withstand voltage characteristic can be further improved.

In the second embodiment, the semiconductor substrate 1A may be used to have the gettering action.

Further, in place of the semiconductor substrate having the polycrystalline layer 1a, other semiconductor substrates which are subjected to the gettering treatment as described above may be used as the semiconductor substrate.

(Sixth Embodiment)

In the above embodiments, the n⁻ layer 6 is formed by the vapor-phase epitaxy method; however, in this embodiment the n⁻ layer 6 is disposed by using a wafer direct bond method.

Figure 7A:
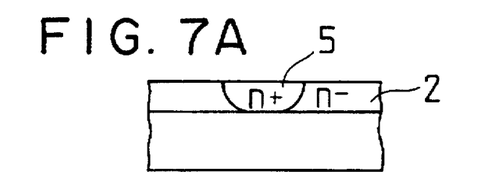
FIGS. 7A and 7B are sectional views showing a manufacturing process according to a sixth embodiment of the present invention.
Figure 7B:
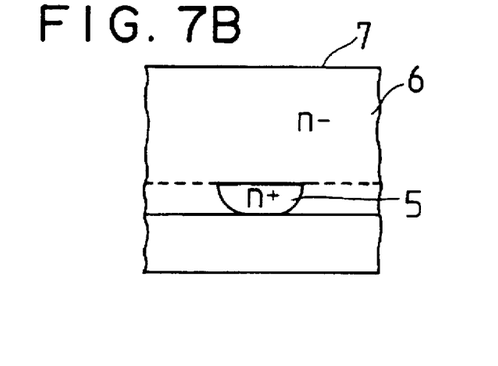

That is, a diffusion region 5 is formed in an n⁻ layer 2 on a substrate in the same manner as the embodiments as described above, and the surface of the result (the surfaces of the diffusion region 5 and the n⁻ layer 2) is subjected to a mirror-polishing treatment (FIG. 7A). The mirror-polished substrate and a semiconductor substrate having an n⁻ layer 6 are bonded to each other by using the wafer direct bond method (FIG. 7B). Thereafter, the MOS structure portion is formed on the surface of the n⁻ layer 6 in the same manner as the first embodiment.

In this embodiment, the n⁻ layer 6 is provided by the wafer direct bond method, so that there occurs little unevenness on the surface 7 of the n⁻ layer 6, and thus the gate-source insulation withstand voltage characteristic due to the surface unevenness of the n⁻ layer 6 is prevented from being deteriorated.

(Seventh Embodiment)

FIGS. 8A to 8F are views showing a manufacturing process of a semiconductor device according to a seventh embodiment of the present invention.

Figure 8A:
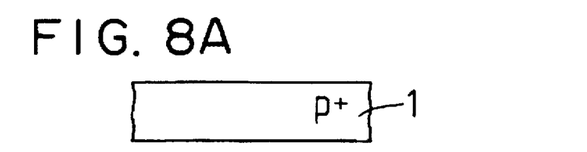
FIGS. 8A to 8F are sectional views showing a manufacturing process according to a seventh embodiment of the present invention.
Figure 8B:
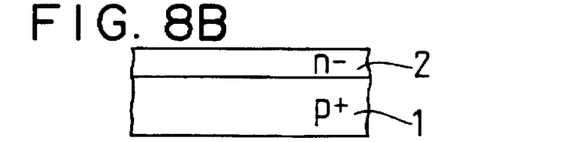
Figure 8C:
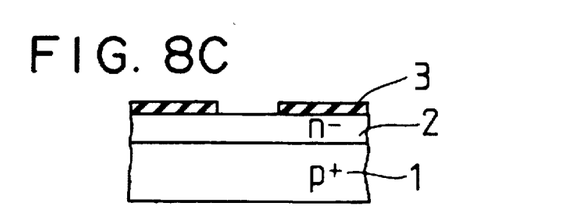
Figure 8D:
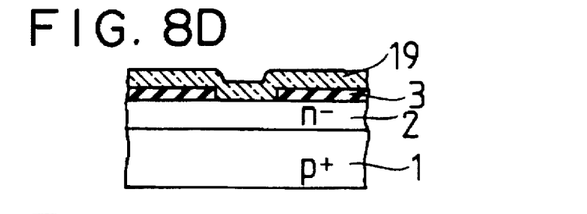
Figure 8E:
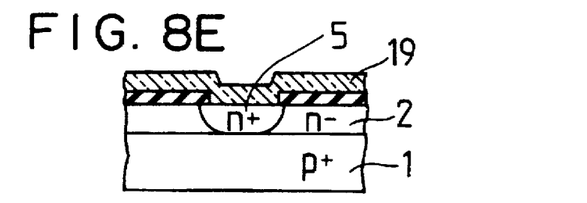

The steps of FIGS. 8A to 8C are identical to those of FIGS. 1A to 1C. That is, the n⁻ layer 2 is formed on the silicon p⁺ layer 1, the thermal oxide film 3 is formed on the surface of the n⁻ layer 2, and then a diffusion window is formed. Subsequently, a PSG (phosphosilicate glass) film 19 which is a glass containing n-type impurities (phosphorus, for example) is formed on the surface thereof by a CVD method (FIG. 8D), and then subjected to a predetermined thermal treatment so that phosphorus contained in the PSG film 19 is diffused into the n⁻ layer 2, thereby forming the n⁺ diffusion region 5 (FIG. 8E).

Figure 8F:
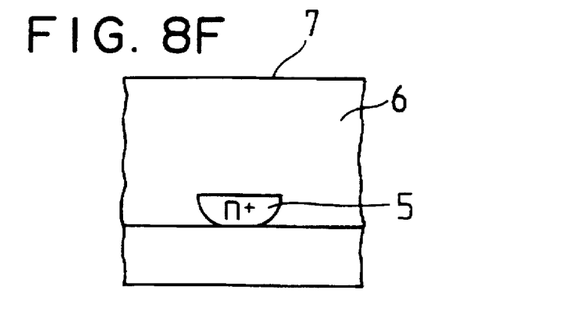

Thereafter, the oxide film 3 and the PSG film 19 are removed by etching liquid of hydrofluoric acid group, and the n⁻ layer 6 is formed by the vapor-phase epitaxy method (FIG. 8F). Thereafter, the MOS structure portion is formed on the surface 7 of the n⁻ layer 6 in the same manner as the first embodiment.

In the seventh embodiment, the PSG film 19 is formed by the CVD method, and the n⁺ diffusion region 5 is formed by the thermal treatment. By using these methods, the oxide film formed on the diffusion window is designed to be very thin, and thus the unevenness of the surface 7 of the n⁻ layer 6 can be greatly reduced. Accordingly, even when the MOS structure portion is formed on the surface 7, no deterioration occurs in the gate-source insulation withstand voltage characteristic.

In the seventh embodiment, the semiconductor substrate which is subjected to the gettering treatment like the third embodiment may be used, and the n⁻ layer 6 may be formed by using the direct bond method like the sixth embodiment.

In the embodiments as described above, the n⁺ diffusion region 5 may be formed so as to come into contact with the boundary surfaces of the n⁻ layer 2 and the n⁻ layer 6, or may be embedded in the neighborhood of the boundary faces.

Further, the present invention is applied not only to the vertical type IGBT as described in the above embodiments, but also to a vertical MOSFET.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An insulated gate type field effect transistor comprising:
a first semiconductor layer having a high impurity concentration;
a second semiconductor layer of a first conductivity type, disposed on said first semiconductor layer and having a low impurity concentration;
a well region of a second conductivity type, partially formed at a surface of said second semiconductor layer;
a surface semiconductor region of said first conductivity type, partially formed in said well region, wherein a channel region is defined at a surface of said well region between said second semiconductor layer and said surface semiconductor region;
a gate electrode disposed, corresponding to at least said channel region, on said surface of said well region with a gate insulation film interposed therebetween;
an embedded semiconductor region disposed at or adjacent to an interface between said first and second semiconductor layers and having a high impurity concentration;
a first electrode contacting at least said surface semiconductor region; and
a second electrode contacting said first semiconductor layer,
wherein said embedded semiconductor region has a recess in a concentration profile thereof at an upper side thereof, and said surface of said second semiconductor layer has a flattened surface having an unevenness the dimension of which is at most 8 nm.

2. An insulated gate type field effect transistor as claimed in claim 1, wherein said embedded semiconductor region is of said first conductivity type.

3. An insulated gate type field effect transistor as claimed in claim 2, wherein said first semiconductor layer is of said second conductivity type.

4. An insulated gate type field effect transistor as claimed in claim 1, wherein said first semiconductor layer is of said second conductivity type.

5. An insulated gate type field effect transistor as claimed in claim 1, wherein said first electrode is a source electrode and said second electrode is a drain electrode.

6. An insulated gate type field effect transistor as claimed in claim 1, wherein said first semiconductor layer includes a region which functions as a gettering site.

7. An insulated gate type field effect transistor as claimed in claim 6, wherein said first semiconductor layer includes a monocrystalline semiconductor layer and a polycrystalline semiconductor layer having a same conductivity type as said monocrystalline semiconductor layer, said polycrystalline semiconductor layer being disposed as said region functioning as said gettering site.

8. An insulated gate type field effect transistor as claimed in claim 1, wherein said embedded semiconductor region is located under the position of said gate electrode.

9. An insulated gate type field effect transistor comprising:

a first semiconductor layer;

a second semiconductor layer disposed over said first semiconductor layer, said second semiconductor layer being of a first conductivity type;

an embedded semiconductor region disposed at or adjacent to an interface between said first and second semiconductor layers;

a well region formed at a surface of said second semiconductor layer, said well region being of a second conductivity type;

a surface semiconductor region formed in said well region, said surface semiconductor region being of said first conductivity type; and a gate electrode disposed to collectively form a planar-type double-diffused MOSFET structure with said second semiconductor layer, said well region and said surface semiconductor region;

wherein a channel region of said MOSFET structure defined at a surface of said well region between said second semiconductor layer and said surface semiconductor region is associated with said surface of said second semiconductor layer, an unevenness of which is set to be at most 8 nm.

10. An insulated gate type field effect transistor as claimed in claim 9, wherein said first conductivity type is an n type and said second conductivity type is a p type.

11. An insulated gate type field effect transistor as claimed in claim 9, wherein said embedded semiconductor region is of said first conductivity type and has an impurity concentration higher than said second semiconductor layer.

12. An insulated gate type field effect transistor as claimed in claim 9, wherein said first semiconductor layer is of said second conductivity type.

13. An insulated gate type field effect transistor as claimed in claim 9, wherein said first semiconductor layer includes a region which functions as a gettering site.

14. An insulated gate type field effect transistor according to claim 13, wherein said first semiconductor layer includes a monocrystalline semiconductor layer and a polycrystalline semiconductor layer, both having a same conductivity type, said region which functions as a gettering site comprising said polycrystalline semiconductor layer.

15. An insulated gate type field effect transistor according to claim 9, wherein said embedded semiconductor region is located under said gate electrode.

\* \* \* \* \*